Dec. 7, 1965 N. C. HEKIMIAN 3,222,619

FREQUENCY SHIFT KEYING GENERATOR

Filed Oct. 29, 1963

INVENTOR

Norris C. Hekimian,

BY [signature]

ATTORNEY

3,222,619
FREQUENCY SHIFT KEYING GENERATOR

Norris Carroll Hekimian, Kensington, Md., assignor to The United States of America as represented by the Secretary of the Army Filed Oct. 29, 1963, Ser. No. 319,900
3 Claims. (Cl. 331—179)
(Granted under Title 35, U.S. Code (1952), sec. 266)

Figure 1:
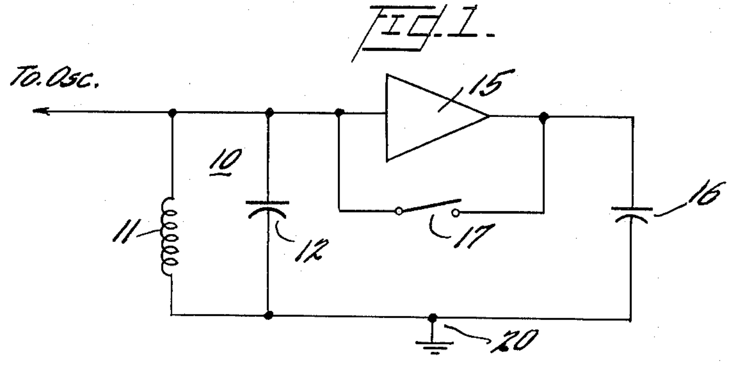

The invention described herein may be manufactured and used by or for the Government for governmental purposes without the payment to me of any royalty thereon.

This invention relates to a frequency shift keying generator, and more particularly to a frequency shift keying generator having substantially no transient effects.

In the past, frequency shift keying generators have used capacitive shifting, but have achieved little success in obtaining smooth operation free of transient effects. Normally, when an oscillator is shifted in frequency by insertion of series impedance or shunt admittance, the inserted elements disrupt the wave train by introducing a transient from its own initial conditions. In particular, a capacitor keyed across an LC oscillator tank generally will introduce a zero initial charge. This causes an abrupt redistribution of charge between the added capacitor and the tank capacitor thereby causing a transient in the output of the oscillator. Chances are high that this transient will be twice the magnitude of the output signal thus creating a very undesirable distortion in the output.

Another problem encountered in the past using capacitive-shifting elements was that it was not possible to effect a satisfactorily large shift in frequency in relation to the carrier frequency, since, particularly at low frequencies, the capacitive-shifting elements changed the impedance of the oscillatory circuit and, therefore, the oscillator output.

It is an object of this invention to provide a new and improved frequency shift keying generator.

It is another object of this invention to provide a frequency shift keying generator with minimized transient effects.

It is still a further object of this invention to minimize the transient effects of a frequency shift keying generator by forcing a shifting capacitor to have essentially the same voltage as the frequency-determining circuit at all times, even when the capacitor is not causing a frequency shift.

It is another object of this invention to provide a frequency shift keying generator using capacitive-shifting elements in which a relatively large shift in frequency compared to the carrier frequency is obtained.

With these and other objects in view, a frequency shift keying generator embodying the invention may include an oscillator, first means for determining frequency and designed to operate the oscillator at one predetermined frequency, second frequency-determining means for shifting the oscillator to a second predetermined frequency, and means connecting the first and second means to the oscillator alternately and designed to maintain the voltage across the first and second frequency-determining means the same at all times to eliminate any transients that might otherwise occur during the shifting.

More specifically, in one embodiment of the present invention, a frequency shift keying generator is provided having an oscillator and an LC tank circuit connected to the oscillator. Connected in parallel with the tank circuit are a series-connected, push-pull complementary emitter-follower amplifier and a shifting capacitor. The amplifier has a single pole switch connected across it. Initially, with the switch open, a frequency will be generated which is determined by the LC tank circuit which is set to resonate at that frequency. The amplifier maintains the voltage across the tank circuit and the shifting capacitor the same. Then, when the switch is closed, the amplifier is short-circuited leaving the shifting capacitor connected directly across the capacitor of the tank circuit and thereby causing the oscillator to shift to another frequency. This frequency shift is relatively large compared to the carrier frequency. Both during and after the shifting, the tank circuit and shifting capacitor still have the same voltage thereacross. Thus, by forcing the shifting capacitor to have the same voltage as the tank circuit at all times, all transient effects that might ordinarily occur during the shifting are eliminated.

Figure 2:
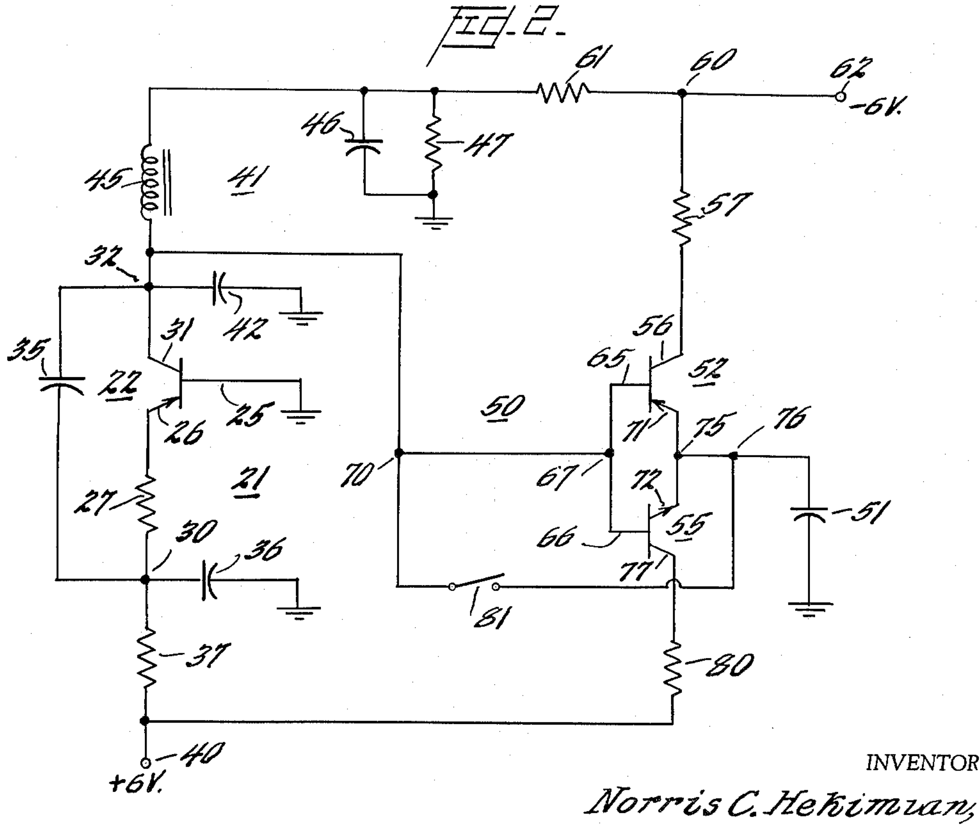

Other objects and advantages of the present invention will be apparent from the following detailed description, when considered in conjunction with the accompanying drawing, wherein:

FIG. 1 is a basic frequency shift keying circuit showing an embodiment of the shifting circuit, and FIG. 2 is a practical frequency shift keying generator showing one possible embodiment of the present invention and including the shifting circuit illustrated in FIG. 1.

In the frequency shift keying circuit shown in FIG. 1 there is a frequency-determining or resonant circuit 10. This frequency-determining or resonant circuit 10 is an ordinary LC tank circuit consisting of an inductor 11 connected in parallel with a capacitor 12. Connected in parallel with the tank circuit 10 are an amplifier 15 and a shifting capacitor 16. The amplifier 15 and the shifting capacitor 16 are series connected. Across the amplifier 15 is a single pole switch 17. The entire circuit is connected to a reference potential such as the ground connection designated by the numeral 20.

In the operation of the basic frequency shift keying circuit shown in FIG. 1, the inductor 11 and capacitor 12 are selected to resonate at the higher of two chosen operating frequencies. When the switch 17 is in the open position, the amplifier 15 is conducting. The amplifier 15 is selected to provide close to unity gain, a high input impedance, and a low output impedance. In other words, the amplifier 15 is selected to provide significant current gain but only unity voltage gain. If the current gain is B, the capacitor 16 of C microfarads appears to the tank 10 as a much smaller capacitor, in fact one that is $C/B$ microfarads. Thus, when the switch 17 is open, the circuit is operating at the higher frequency.

When the switch 17 is closed to the tank 10, the amplifier 15 is disabled and the full value, C, of capacitor 16 is impressed across the tank 10, thereby shifting the circuit to the lower operating frequency, the shift being a relatively large shift in frequency compared to the carrier frequency. Therefore, by selecting the amplifier 15 to have a unity voltage gain, the capacitor 16 has the same voltage as the tank 10 at all times, thus eliminating any transients due to the shifting.

In FIG. 2 there is shown a frequency shift keying generator having an oscillator circuit 21, of the Colpitts type, provided with a transistor 22 of the PNP type, such as a 2N414. A base 25 of the transistor 22 is connected to ground. An emitter 26 of the transistor 22 is connected to a resistor 27 which is connected to a junction 30. A collector 31 of the transistor 22 is connected to a second junction 32, and connected across the junctions 30 and 32 is a capacitor 35. Also connected to junction 30 is a capacitor 36 whose other side is grounded. Connected to the junction 30 is a resistor 37 which in turn is connected to a terminal 40 which has a positive potential (e.g., +6 volts) applied thereto.

Connected to the oscillator 21 is a resonant or frequency-determining circuit 41 consisting of a capacitor 42, one side of which is connected to the junction 32 and the other side of which is grounded and an inductor 45, one side of which is also connected to the junction 32.

Connected to the other side of the inductor 45 is a bypass capacitor 46 in parallel with a resistor 47, the parallel combination of capacitor 46 and resistor 47 being grounded.

Connected in parallel with the resonant or frequency-determining circuit 41 are a series-connected amplifier 50 and a shifting capacitor 51. The amplifier 50 is a push-pull complementary emitter-follower amplifier having a PNP transistor 52 such as 2N414 and an NPN transistor 55 such as a 2N438. A collector 56 of the PNP transistor 52 is connected to a current-limiting resistor 57 which is connected to a junction 60. Connected to the junction 60 is one side of a resistor 61, the other side of which is connected to one side of the resonant or frequency-determining circuit through the parallel combination of the capacitor 46 and the resistor 47. Also connected to the junction 60 is a terminal 62 which has a negative potential (e.g., —6 volts) applied thereto.

A base 65 of the PNP transistor 52 is connected to a base 66 of the NPN transistor 55, the two bases 65 and 66 being joined at a junction 67 which in turn is connected to a junction 70 which is connected to the junction 32. An emitter 71 of the PNP transistor 52 is directly connected to the emitter 72 of the NPN transistor 55, the two emitters 71 and 72 being joined at the junction 75 to which is connected the shifting capacitor 51 through a junction 76. The other side of the shifting capacitor 51 is connected to ground. A collector 77 of the NPN transistor 55 is connected to a current-limiting resistor 80 which in turn is connected to the terminal 40. Across the two junctions 70 and 76 is connected a single pole switch 81.

In the operation of a frequency shift keying generator shown in FIG. 2, when the switch 81 is opened and power is supplied to the oscillator 21, the transistor 22 conducts. The resistor 37 controls the bias current to the emitter 26 of transistor 22, and the resistor 27 provides a lower limit on the impedance of the oscillator 21 and proves its waveform. The capacitors 35 and 36, which are connected in series, provide impedance transformation for the oscillator 21. The capacitors 35 and 36, connected in parallel with the capacitor 42, determine the resonant frequency which is generated by the oscillator 21 when switch 81 is open. The voltage at the collector 31 of the transistor 22 runs from a low, negagtive value near ground to twice the D.C. value at the collector 31. The D.C. voltage at the collector 31 is set to be slightly less than one-half the supply voltage and is determined by the voltage divider action of the resistors 47 and 61.

The capacitor 46 serves as a bypass for the A.C. collector current. The peak collector voltage never exceeds the voltage from the power source. Therefore, the transistor 22 will never have a base voltage greater than the collector voltage, and it will be properly biased at all times due to the divider action of resistors 47 and 61. Feedback from the collector 31 to the emitter 26 sustains oscillations. While the switch 81 is open, the amplifier 50, of the push-pull complementary emitter-follower type as described above, provides close to unity gain, a high input impedance and a low output impedance. In other words, the amplifier 50 provides a significant current gain but only unitary voltage gain.

For purposes of illustration, assume that the current gain of the transistor 52 is $B_1$ while the current gain of the transistor 55 is $B_2$. The transistor 52 conducts when the voltage of tank circuit 41 swings negatively, and the capacitor 51 of C microfarads appears to the tank circuit 41 as a capacitor of $C/B_1$ microfarads. When the voltage of the tank circuit 41 swings positively, the transistor 52 is cut off, the transistor 55 conducts, and the capacitor 51 appears to the tank circuit 41 as a capacitor of $C/B_2$ microfarads. In either case, the peak current is about + or —1 ma. No D.C. return is ever required for a push-pull emitter-follower output, and, hence, the Q of tank circuit 41 is hardly deteriorated. Since the voltage gain of the amplifier 50 is unity, the voltage across the capacitor 51 and the tank circuit 41 is the same at all times. The resistors 57 and 80 serve as current limiters to protect the transistors 52 and 55. The transistor 55 provides a complementary drive and maintains push-pull amplification in both directions across the capacitor 51.

When the switch 81 is closed, the emitters 71 and 72 are shorted to the bases 65 and 66, respectively, of the transistors 52 and 55, thus completely disabling both transistors. When both transistors 52 and 55 are disabled, the amplifier 50 is disabled and the full value, C, of the capacitor 51 is impressed across the tank circuit 41, thereby causing the oscillator 21 to shift to a lower frequency, the shift being a relatively large shift in frequency compared to the carrier frequency. However, the voltage across the capacitor 51 and the tank circuit 41 is the same. By using transistor 55 rather than a resistor, when switch 81 is closed, both transistors 52 and 55 are disabled simultaneously, and, at the same time, the output impedance of the amplifier 50 is greatly raised to keep from loading the capacitor 51. The capacitor 51 is of relatively low value so that, while operating at low frequencies, the oscillator gain will not be greatly reduced, nor will the oscillator stop when the frequency shift takes place. Thus, by maintaining the voltage across the capacitor 51 and the tank circuit 41 the same at all times, the desired result, the elimination of transient effects, is obtained.

Many modifications of the present invention may be made without departing from the spirit and scope thereof. For example, instead of using a single pole switch, keying could be accomplished electronically by simply gating on and off the two collector supplies for transistors 52 and 55. This can be done easily since the peak collector currents are about + or — 1 ma. To improve operations still further, the transistors 52 and 55 could be replaced by Darlington-compounded emitter-followers for closer to unity gain. In fact, any conventional operational amplifier would be suitable as long as the voltage gain is close to unity. Also, many oscillator variations are possible.

What is claimed is:

1. A frequency shift keying generator which comprises a first reactive storage element having an oscillatory voltage thereacross substantially equal in value to the oscillatory voltage present across at least a second reactive storage element with which it forms a resonant circuit, and switching means having two states and connecting the first and second elements such that when the switching means are in a first state the first element presents a first value causing oscillations of a first frequency and when the switching means are in a second state the first element presents a second value causing a shift in frequency to a second frequency, the substantially equal oscillatory voltage across the first element during both states eliminating any transients that might otherwise occur during the shifting.

2. A frequency shift keying generator which comprises an oscillator circuit including first and second reactive storage elements which form a resonant circuit and across which are oscillatory voltages that are substantially equal in value, and switching means having two states and connecting the first and second elements such that when the switching means is in a first of its two states the first reactive storage element presents a first value causing oscillations of a first frequency and when the switching means is in its second state the first reactive storage element presents a second value causing a shift in the frequency of the oscillations to a second frequency, the substantially equal oscillatory voltages across the first reactive storage element during both states of the switching means eliminating any transients that might otherwise occur during the shifting.

3. A frequency shift keying generator which comprises an oscillator circuit including a capacitor and at least an inductor which form a resonant circuit, switching means having two states connected in series with the capacitor and designed such that substantially equal oscillatory voltages are present across the resonant circuit when the switching means is in either of its two states, the switching means being further designed such that when it is in one of its states the capacitor presents a first value of capacitance causing oscillations of a first frequency and when it is in its second state the capacitor presents a second value of capacitance causing the oscillations to shift to a second frequency, the substantially equal oscillatory voltage across the capacitor during both states of the switching means eliminating any transients that might otherwise occur during the frequency shifting.

References Cited by the Examiner

UNITED STATES PATENTS

| | | | |
|---|---|---|---|
| 2,469,289 | 5/1949 | Beard et al. | 331—179 |
| 2,930,991 | 3/1960 | Edwards | 331—179 |

ROY LAKE, *Primary Examiner.*

JOHN KOMINSKI, *Examiner.*